(12) United States Patent
Park et al.

(10) Patent No.: US 6,426,300 B2
(45) Date of Patent: Jul. 30, 2002

(54) METHOD FOR FABRICATING SEMICONDUCTOR DEVICE BY USING ETCHING POLYMER

(75) Inventors: Won Soung Park; Phil Goo Kong, both of Kyoungki-do; Ho Seok Lee, Seoul; Dong Duk Lee, Kyoungki-do, all of (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/751,388

(22) Filed: Jan. 2, 2001

(30) Foreign Application Priority Data

Dec. 30, 1999 (KR) .............................. 99-66925

(51) Int. Cl.⁷ .................. H01L 21/302; H01L 21/3065; H01L 21/308
(52) U.S. Cl. ........................................ 438/700; 438/706
(58) Field of Search ................................ 438/424, 706, 438/695, 696, 700, 710, 738

(56) References Cited

U.S. PATENT DOCUMENTS 5,801,083 A * 9/1998 Yu et al. ...................... 438/424
6,287,974 B1 * 9/2001 Miller ......................... 438/706

FOREIGN PATENT DOCUMENTS

JP         6208965        7/1994

\* cited by examiner

*Primary Examiner*—Richard Elms
*Assistant Examiner*—Beth E. Owens
(74) *Attorney, Agent, or Firm*—Pillsbury Winthrop LLP

(57) ABSTRACT

The present invention discloses a method for fabricating a semiconductor device using an etch-resistant polymer. The method includes a step for the in-situ generation of a polymer layer on the exposed surfaces of a photoresist film pattern, a pad oxide film, and a hard mask layer. This polymer acts as a protective film and prevents photoresist erosion during trench etching processes and improves the etch selectivity. As a result, trench structures can be formed more easily and with improved dimensional control.

5 Claims, 2 Drawing Sheets

METHOD FOR FABRICATING SEMICONDUCTOR DEVICE BY USING ETCHING POLYMER

BACKGROUND OF THE INVENTION

1. Field of the Invention

The present invention relates to a method for fabricating a semiconductor device by using an etching polymer and, in particular, to an improved method suitable for a process having a small photoresist margin during the trench etching process, by generating a polymer on a surface of a photoresist film pattern used as an etching mask. By generating this polymer on the surface of the photoresist before the trench etching process, and employing the polymer as a protective film for preventing photoresist erosion during the etching process, the present method improves the etching resistance of the photoresist.

2. Description of the Background Art

When a semiconductor device is fabricated using a method having a design rule below 0.10 µm, the increase in trench depth and reduction in design rule require that the thickness of the photoresist mask is reduced in the shallow trench isolation (STI) process. Accordingly, the etching margin for the photoresist mask becomes excessively small in a trench etching process. In some cases, the photoresist film will be eroded during the trench etching process, making it impossible to etch the desired pattern into the semiconductor substrate while maintaining the desired degree of dimensional control.

SUMMARY OF THE INVENTION

Accordingly, an object of the present invention is to provide a method for fabricating a semiconductor device by using an etching polymer which can improve the etch selectively or etch ratio with respect to a photoresist, by generating a polymer on the photoresist surface, and employing this polymer as a protective film for preventing photoresist erosion during the trench etch process, particularly for semiconductor devices fabricated using methods with a design rule below 0.10 µm.

In order to achieve the above-described object of the present invention, a method for fabricating a semiconductor device by using an etching polymer, includes the steps of: forming an insulating film having a stacked structure comprising a pad oxide film and a hard mask layer on a semiconductor substrate; forming a photoresist film pattern that exposes a device isolation region on the insulating film; etching the insulating film using the photoresist film pattern as an etching mask to expose the semiconductor substrate; forming a polymer layer on the surfaces of the photoresist film pattern and the insulating film pattern; form a trench for device isolation, by etching the exposed semiconductor substrate using the polymer layer as an etching mask; and forming a device isolation film in the trench.

BRIEF DESCRIPTION OF THE DRAWINGS

The present invention will become better understood with reference to the accompanying figures. These figures are provided by way of illustration only and thus should not be understood to limit the scope of the present invention unnecessarily.

DETAILED DESCRIPTION OF THE PREFERRED EMBODIMENTS

A method for fabricating a semiconductor device by using an etching polymer in accordance with the present invention will now be described in detail with reference to the accompanying figures.

Figure 1:
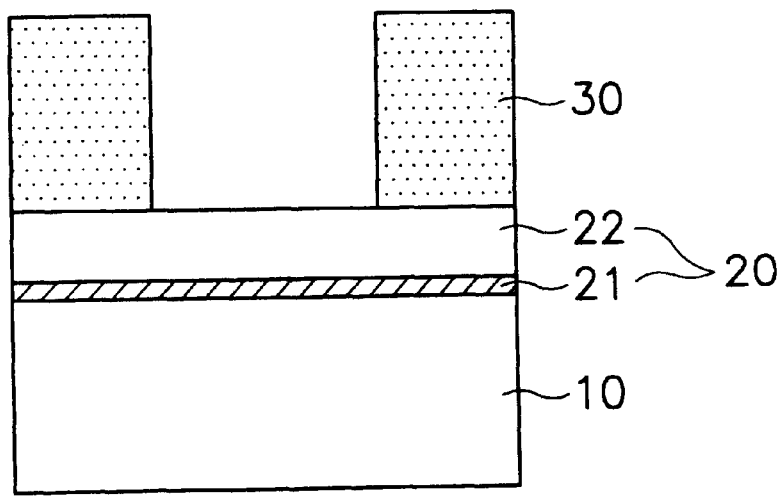
FIGS. 1 through 4 are cross-sectional diagrams illustrating sequential steps of a trench formation process of a method for fabricating a semiconductor device by using an etching polymer according to the present invention.

As illustrated in FIG. 1, a pad oxide film 21 and a hard mask layer 22 are formed on a semiconductor substrate 10. Here, the hard mask layer 22 may comprise a $Si_3N_4$ film, SiON film or an oxide film.

A photoresist film pattern 30 is then formed on the hard mask layer 22. The photoresist film pattern 30 is formed in a conventional manner by coating a photoresist film over the hard mask layer 22 and then exposing the photoresist to form a device isolation pattern.

Figure 2:
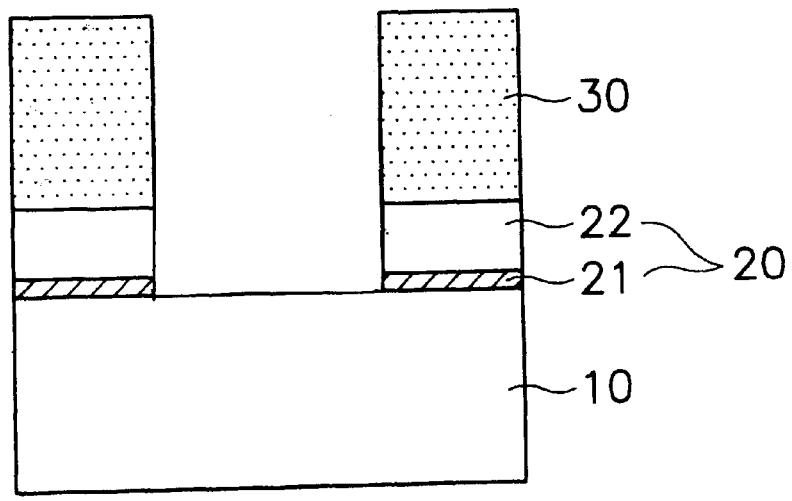

As shown in FIG. 2, an insulating film 20 having a stacked structure of the hard mask layer 22 and the pad oxide film 21 is then etched using the photoresist film pattern 30 as a mask, to expose the surface of the semiconductor substrate 10.

Figure 3:
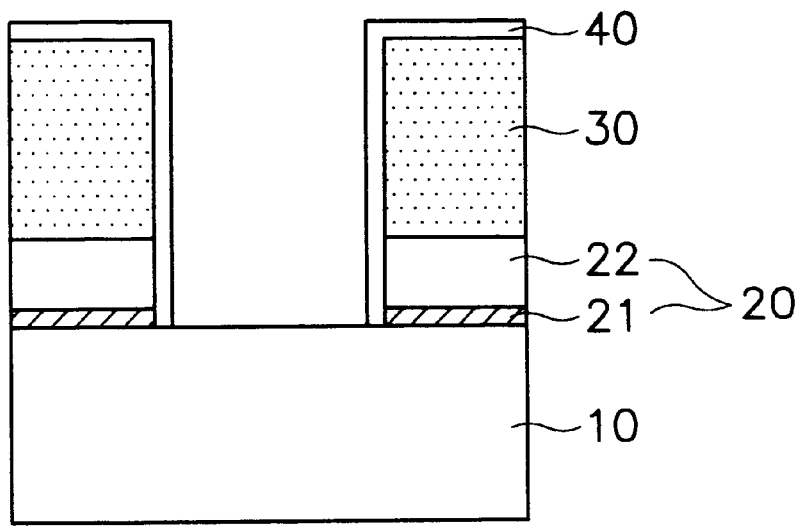

Referring to FIG. 3, a polymer layer 40 is then formed over the resultant structures formed on the semiconductor substrate 10.

Specifically, the polymer layer 40 is formed by injecting a main gas, preferably $Cl_2$, HBr, $SF_6$ or $CF_4$, into an etching system before etching the semiconductor substrate 10 and inducing polymerization of the resist layer by controlling the plasma parameters within the etching system. The main gas is injected in a flow rate of 10 to 100 SCCM, preferably 30 to 70 SCCM. In addition, during the formation of the polymer layer 40, at least one gas selected from the group consisting of $O_2$, $N_2$ and an inert gas is also injected into the etching system as an auxiliary gas, thereby enhancing adhesion of the polymer.

The etching system is generally a high density plasma chemical vapor deposition (HDPCVD) system. The plasma parameters for forming the polymer layer before the etching process are set up so that pressure is between 10 and 50 mTorr, the source power is between 600 and 2000 W, and the bias power is not more than 100 W.

Figure 4:
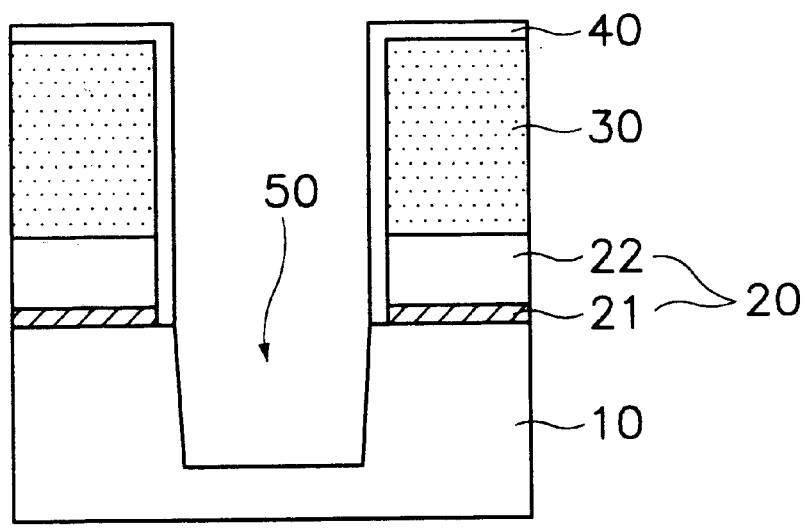

As depicted in FIG. 4, the semiconductor substrate 10 is then etched using the polymer layer as a mask, to form trench 50.

In a succeeding process, the polymer layer 40 and the photoresist film pattern 30 are removed, and a device isolation film (not shown) that fills trench 50 is formed.

The principle of generating the polymer layer 40 will now be described in more detail.

When the power is low and pressure is high in the etching system, reactive ion etching (RIE) by ion bombardment decreases and etching by-products are redeposited on the wafer being etched. That is to say, when the plasma parameters in the etching system are adjusted in order to form the polymer, carbon and perhaps other organic components from the photoresist film pattern 30, silicon from the insulating film 20, and halogen atoms from the main gas are plasma polymerized and redeposited as a polymer layer on the surfaces of the photoresist film pattern 30 and the insulating film 20. This redeposited polymer layer is very resistant to plasma etch and thus efficiently protects the photoresist. In addition, once formed, the polymer layer 40 does not tend to chemically react with plasma consisting of halogen groups, but is physically eroded by high energy ions generated within the plasma. Therefore, etching selectivity between polymer and silicon substrate is higher than that between photoresist and silicon substrate.

When the polymer layer 40 is formed, at least one gas selected from the group consisting of $O_2$, $N_2$ and an inert gas is injected into the etching system as an auxiliary gas. The auxiliary gas serves to enhance adhesion of the polymer, thus improving the etch resistance of the polymer layer 40.

When the photoresist is subjected to the trench etch process without generating the polymer layer, the maximum etch depth is about 2500 Å. However, when the photoresist having the polymer layer is subjected to the trench etch process, the photoresist etching selection ratio is dramatically increased, thereby allowing the maximum etch depth to be increased to 5000Å.

Moreover, the present invention can also be applied to a trench capacitor etching process for forming a trench type capacitor.

As discussed earlier, in accordance with the present invention in the trench etching process, the use of a thin photoresist film is made possible by improving the photoresist selection ratio, and a photoresist margin is increased by forming a deep trench. In addition, using the hard mask layer as an etching mask simplifies the process, thereby improving productivity.

Using the present method, even on semiconductor devices that are highly integrated with design rules below 0.10 μm, and the thickness of the photoresist film is below 0.30 μm for fine pattern formation processes, conventional etching processes can still be used largely as is, thereby saving the expense of new systems and additional process development work.

As the present invention may be embodied in several forms without departing from the spirit or essential characteristics thereof, it should also be understood that the above-described embodiment is not limited by any of the particular details of the foregoing description, unless otherwise specified, but rather should be construed broadly within its spirit and scope as defined in the appended claims. Therefore, all changes and modifications that fall within the metes and bounds of the claims, or equivalences of such metes and bounds are therefore intended to be embraced by the appended claims.

What is claimed is:

1. A method for fabricating a semiconductor device using an etching polymer, comprising the steps of:
    forming an insulating film having a stacked structure comprising a pad oxide film and a hard mask layer on a semiconductor substrate;
    forming a photoresist film pattern on the insulating film, the photoresist film pattern exposing a predetermined device isolation region on the insulating film;
    etching the insulating film using the photoresist film pattern as a mask to form an insulating film pattern, the insulating film pattern exposing predetermined regions of the semiconductor substrate;
    forming a polymer layer on exposed surfaces of the photoresist film pattern, the insulating film pattern, and the semiconductor substrate, wherein the polymer layer is formed by:
        injecting a main gas into a high density plasma chemical vapor deposition system, the main gas comprising at least one gas selected from a group consisting of $Cl_2$, HBr, $SF_6$ and $CF_4$;
        injecting an auxiliary gas into the high density plasma chemical vapor deposition system, the auxiliary gas comprising at least one gas selected from a group consisting of $O_2$, $N_2$ and an inert gas; and
    reacting halogen from the main gas with carbon from the photoresist film pattern and silicon from the insulating film to form a polymer;
    etching the exposed regions of the semiconductor substrate to open a trench for device isolation in the semiconductor substrate; and
    filling the trench with a device isolation film.

2. The method according to claim 1, wherein the plasma parameters of the high density plasma chemical vapor deposition system comprise a pressure between 10 and 50 mTorr, a source power between 600 and 2000 W, and a bias power of not more than 100 W.

3. The method according to claim 1, wherein the main gas is injected at a flow rate of between 10 and 100 SCCM.

4. The method according to claim 1, wherein the main gas is injected at a flow rate of between 30 and 70 SCCM.

5. A method for fabricating a semiconductor device comprising the steps of:
    forming a pad oxide layer on a semiconductor substrate;
    forming a hard mask layer on the pad oxide layer;
    forming a photoresist film pattern on the hard mask layer, the photoresist film pattern exposing a portion of the hard mask layer;
    etching the hard mask layer and the pad oxide layer using the photoresist film pattern as an etch mask to form an insulating film pattern, the insulating film pattern exposing a predetermined region of the semiconductor substrate;
    forming a polymer layer on exposed surfaces of the photoresist film pattern and the insulating film pattern, without substantially etching the semiconductor substrate, the step of forming the polymer layer further comprising:
        injecting a main gas into a high density plasma chemical vapor deposition system, the main gas comprising at least one gas selected from a group consisting of $Cl_2$, HBr, $SF_6$ and $CF_4$;
        injecting an auxiliary gas into the high density plasma chemical vapor deposition system, the auxiliary gas comprising at least one gas selected from a group consisting of $O_2$, $N_2$ and an inert gas; and
        reacting halogen from the main gas with carbon from the photoresist film pattern and silicon from the insulating film to form the polymer while maintaining a basis power of less than 100 W;
    etching the predetermined region of the semiconductor substrate to form a trench, the trench being characterized by a trench profile;
    removing the polymer layer, the photoresist film pattern; and
    filling the trench with a device isolation film, the trench profile remaining substantially unchanged.

* * * * *